United States Patent
Banerjee et al.

(10) Patent No.: US 11,334,702 B1
(45) Date of Patent: May 17, 2022

(54) MIXED-SIGNAL SIMULATION FOR COMPLEX DESIGN TOPOLOGIES

(71) Applicant: Siemens Industry Software Inc., Plano, TX (US)

(72) Inventors: Kingshuk Banerjee, Austin, TX (US); Roshan Lal, Uttar Pradesh (IN); Anil Arora, Uttar Pradesh (IN); Manjul Kishore Dudeja, Austin, TX (US)

(73) Assignee: Siemens Industry Software Inc., Plano, TX (US)

( * ) Notice: Subject to any disclaimer, the term of this patent is extended or adjusted under 35 U.S.C. 154(b) by 0 days.

(21) Appl. No.: 17/173,963

(22) Filed: Feb. 11, 2021

(51) Int. Cl.
  *G06F 30/38* (2020.01)
  *G06F 30/3308* (2020.01)
  *G06F 30/398* (2020.01)

(52) U.S. Cl.
  CPC .......... *G06F 30/38* (2020.01); *G06F 30/3308* (2020.01); *G06F 30/398* (2020.01)

(58) Field of Classification Search
  CPC ..... G06F 30/38; G06F 30/3308; G06F 30/398
  USPC ............... 716/105, 106, 111, 136; 703/4, 15
  See application file for complete search history.

(56) References Cited

U.S. PATENT DOCUMENTS

| | | | | |
|---|---|---|---|---|
| 4,792,913 A * | 12/1988 | Buckland | ............... | G06F 30/367 708/3 |
| 8,145,458 B1 * | 3/2012 | Kukal | ................... | G06F 30/367 703/4 |
| 8,201,137 B1 * | 6/2012 | Bhushan | ............... | G06F 30/367 716/139 |
| 8,504,346 B1 * | 8/2013 | Kolpekwar | ............. | G06F 30/30 703/14 |
| 8,601,412 B1 * | 12/2013 | O'Riordan | ............ | G06F 30/327 716/103 |
| 10,970,441 B1 * | 4/2021 | Zhang | ..................... | G06F 30/33 |
| 2002/0049576 A1 * | 4/2002 | Meyer | .................. | G06F 30/367 703/14 |
| 2003/0154061 A1 * | 8/2003 | Willis | ................... | G06F 30/367 703/4 |
| 2006/0215743 A1 * | 9/2006 | Lang | ....................... | G06F 30/20 375/224 |
| 2007/0244686 A1 * | 10/2007 | Chang | .................. | G06F 30/367 703/19 |

(Continued)

FOREIGN PATENT DOCUMENTS

WO WO-2004070632 A2 * 8/2004 ............. G06F 30/20

*Primary Examiner* — Phallaka Kik

(57) ABSTRACT

A computing system implementing a design verification system can elaborate a mixed-signal circuit design having a complex sandwich hierarchy using a standard digital solver and a standard analog solver, as opposed to a tightly coupled custom elaboration engine. The design verification system can parse the mixed-signal circuit design to identify analog design blocks and flatten the analog design blocks into the structural proxy blocks having parameter connections to digital design blocks in the mixed-signal circuit design. The design verification system can replace an analog portion of the mixed-signal circuit design with the structural proxy blocks and elaborate the structural proxy blocks and digital design blocks associated with a digital portion of the mixed-signal circuit design. The design verification system can elaborate the analog portion of the mixed-signal design and simulate the elaborated analog portion with an analog simulator and the elaborated digital portion with a digital simulator.

20 Claims, 8 Drawing Sheets

(56) References Cited

U.S. PATENT DOCUMENTS

| | | | |
|---|---|---|---|
| 2013/0338991 A1* | 12/2013 | Lin | G06F 30/398 |
| | | | 703/14 |
| 2014/0173537 A1* | 6/2014 | Mohanty | G06F 30/327 |
| | | | 716/103 |
| 2016/0110483 A1* | 4/2016 | Koo | G06F 30/367 |
| | | | 716/113 |
| 2017/0124239 A1* | 5/2017 | Surendran | G06F 30/3323 |
| 2020/0293725 A1* | 9/2020 | Clauvelin | G06F 17/17 |

* cited by examiner

ANALOG DESIGN BLOCKS                    FLATTENED DESIGN BLOCKS

MIXED-SIGNAL SIMULATION FOR COMPLEX DESIGN TOPOLOGIES

TECHNICAL FIELD

This application is generally related to electronic design automation and, more specifically, to mixed-signal simulation for complex design topologies.

BACKGROUND

Designing and fabricating electronic systems typically involves many steps, known as a "design flow." The particular steps of a design flow often are dependent upon the type of electronic system to be manufactured, its complexity, the design team, and the fabricator or foundry that will manufacture the electronic system from a design.

Initially, a specification for a new electronic system can be transformed into a logical design. When the electronic system includes a combination of digital circuitry and analog circuitry, such as with System-On-a-Chip (SOC) devices or the like, the logical design can be a mixed-signal design describing the electronic system in terms of both the exchange of analog and digital signals between circuit components and the operations that can be performed on those signals. These mixed-signal designs are typically written in one or more Hardware Design Languages (HDLs), such as System Verilog, Verilog, Verilog Analog (Verilog-A), Very high speed integrated circuit Hardware Design Language (VHDL), Verilog Analog Mixed Signal (Verilog-AMS), VHDL-AMS, System-C, Simulation Program with Integrated Circuit Emphasis (SPICE), Eldo-SPICE, Spectre, or the like.

After the logical design has been generated, verification tools can be utilized to verify a functionality of the logical design, for example, by running simulators and/or hardware emulators, or by utilizing formal techniques, allowing any errors in the design discovered during the verification process to be corrected. Simulators of mixed-signal designs can include both an analog simulator to simulate analog portions of the mixed-signal designs, for example, using a continuous time matrix-based differential equation solver, and a digital simulator to simulate the digital portions of the mixed-signal designs, for example, using an event-based discrete time events processor.

To perform mixed-signal simulation, the simulators partition the mixed-signal design into analog portions and digital portions, and then insert translator cells to enable the simulators to manage inter-solver dependencies between an analog simulation and a digital simulation. The performance and accuracy of mixed-signal simulation directly depends on the number of translator cells inserted by the simulators. Traditional approaches to mixed-signal design partitioning identify where to partition the mixed-signal design by processing signal connectivity in the mixed-signal design. While this partitioning approach allows the simulator a standard and predictable technique to partition the mixed-signal design, it often creates additional digital-analog crossings and thus an excessive number of translator cells that can hamper simulator performance.

In some mixed-signal designs, analog portions and digital portions can be intermixed to create sandwich design structures, for example, with digital blocks and analog blocks stacked on top of each other and connected through interconnects that carry signals from an analog continuous time domain to a digital discrete time domain, and vice versa. Many mixed-signal simulators include custom elaboration engines with tightly integrated analog and digital elaboration, which can elaborate these sandwich design structures. While these custom elaboration engines can elaborate these mixed signal designs, the mixed-signal designers lose the ability to reuse existing design environments or mix-and-match analog and digital simulators from different third party vendors.

SUMMARY

This application discloses a computing system implementing a design verification system to elaborate a mixed-signal circuit design having a complex sandwich hierarchy using a standard digital solver and a standard analog solver, as opposed to a tightly coupled custom elaboration engine. The design verification system can parse the mixed-signal circuit design to identify analog design blocks and flatten the analog design blocks into the structural proxy blocks having parameter connections to digital design blocks in the mixed-signal circuit design. The design verification system can elaborate a digital portion of a mixed-signal circuit design by replacing an analog portion of the mixed-signal circuit design with the structural proxy blocks and elaborating the structural proxy blocks and digital design blocks associated with the digital portion. The design verification system can elaborate the analog portion of the mixed-signal design by separately elaborating the analog design blocks associated with the structural proxy blocks. The design verification system can simulate the elaborated analog portion with an analog simulator and the elaborated digital portion with a digital simulator. Embodiments of will be described below in greater detail.

DETAILED DESCRIPTION

Illustrative Operating Environment

Figure 1:
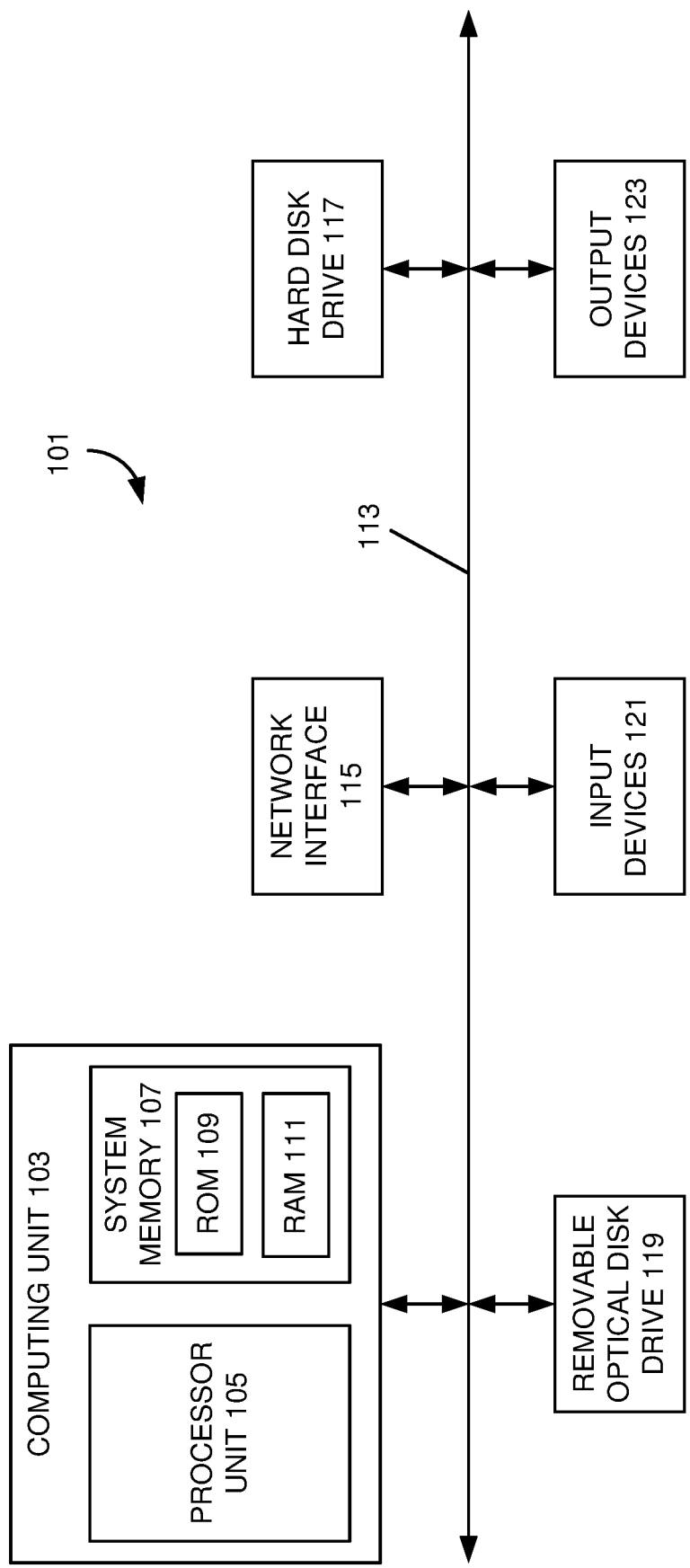
FIGS. 1 and 2 illustrate an example of a computer system of the type that may be used to implement various embodiments.

Various examples may be implemented through the execution of software instructions by a computing device 101, such as a programmable computer. Accordingly, FIG. 1 shows an illustrative example of a computing device 101. As seen in this figure, the computing device 101 includes a computing unit 103 with a processor unit 105 and a system memory 107. The processor unit 105 may be any type of programmable electronic device for executing software instructions, but will conventionally be a microprocessor. The system memory 107 may include both a read-only memory (ROM) 109 and a random access memory (RAM) 111. As will be appreciated by those of ordinary skill in the art, both the read-only memory (ROM) 109 and the random access memory (RAM) 111 may store software instructions for execution by the processor unit 105.

The processor unit 105 and the system memory 107 are connected, either directly or indirectly, through a bus 113 or alternate communication structure, to one or more peripheral devices 115-123. For example, the processor unit 105 or the system memory 107 may be directly or indirectly connected to one or more additional memory storage devices, such as a hard disk drive 117, which can be magnetic and/or removable, a removable optical disk drive 119, and/or a flash memory card. The processor unit 105 and the system memory 107 also may be directly or indirectly connected to one or more input devices 121 and one or more output devices 123. The input devices 121 may include, for example, a keyboard, a pointing device (such as a mouse, touchpad, stylus, trackball, or joystick), a scanner, a camera, and a microphone. The output devices 123 may include, for example, a monitor display, a printer and speakers. With various examples of the computing device 101, one or more of the peripheral devices 115-123 may be internally housed with the computing unit 103. Alternately, one or more of the peripheral devices 115-123 may be external to the housing for the computing unit 103 and connected to the bus 113 through, for example, a Universal Serial Bus (USB) connection.

With some implementations, the computing unit 103 may be directly or indirectly connected to a network interface 115 for communicating with other devices making up a network. The network interface 115 can translate data and control signals from the computing unit 103 into network messages according to one or more communication protocols, such as the transmission control protocol (TCP) and the Internet protocol (IP). Also, the network interface 115 may employ any suitable connection agent (or combination of agents) for connecting to a network, including, for example, a wireless transceiver, a modem, or an Ethernet connection. Such network interfaces and protocols are well known in the art, and thus will not be discussed here in more detail.

It should be appreciated that the computing device 101 is illustrated as an example only, and it not intended to be limiting. Various embodiments may be implemented using one or more computing devices that include the components of the computing device 101 illustrated in FIG. 1, which include only a subset of the components illustrated in FIG. 1, or which include an alternate combination of components, including components that are not shown in FIG. 1. For example, various embodiments may be implemented using a multi-processor computer, a plurality of single and/or multiprocessor computers arranged into a network, or some combination of both.

Figure 2:
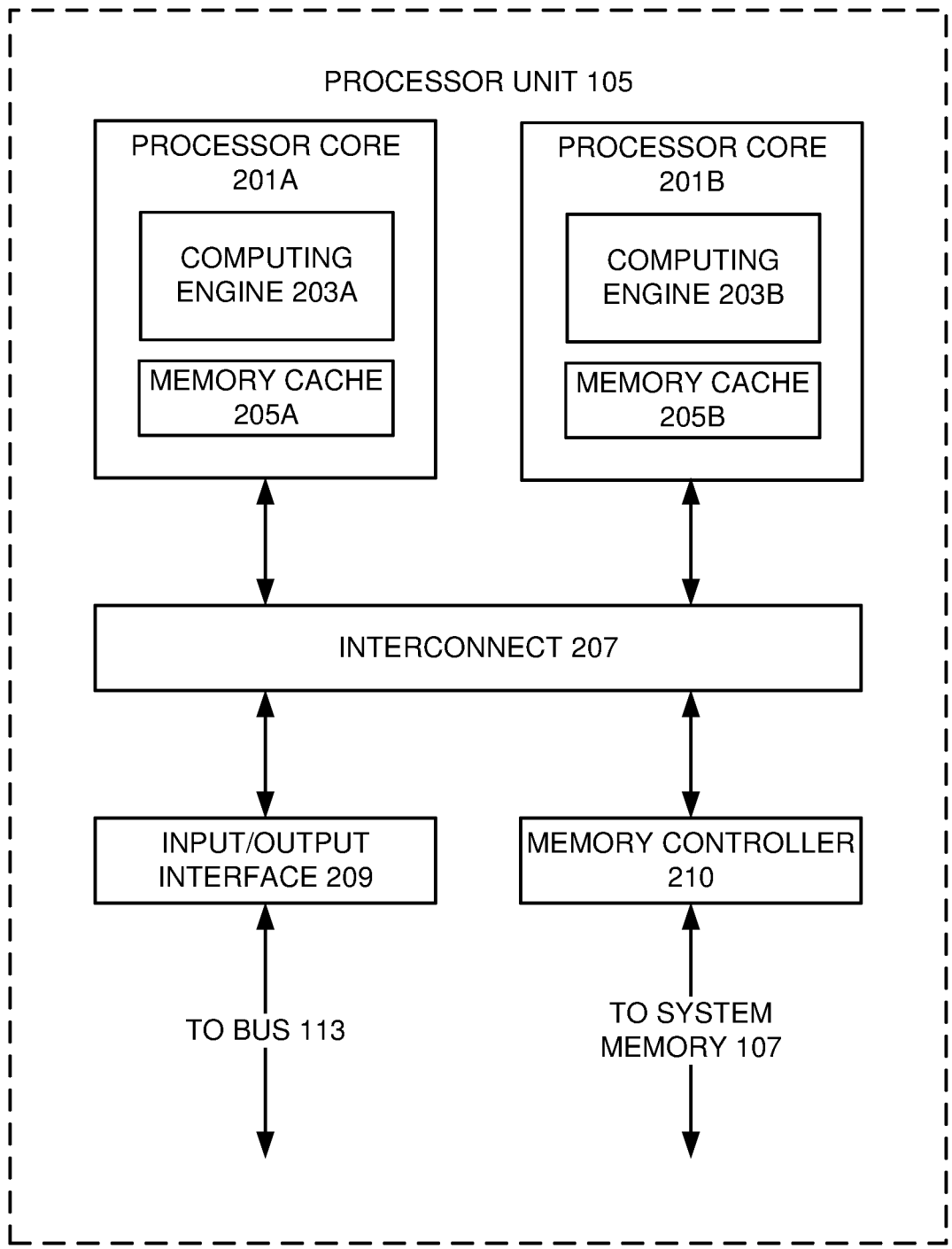

With some implementations, the processor unit 105 can have more than one processor core. Accordingly, FIG. 2 illustrates an example of a multi-core processor unit 105 that may be employed with various embodiments. As seen in this figure, the processor unit 105 includes a plurality of processor cores 201A and 201B. Each processor core 201A and 201B includes a computing engine 203A and 203B, respectively, and a memory cache 205A and 205B, respectively. As known to those of ordinary skill in the art, a computing engine 203A and 203B can include logic devices for performing various computing functions, such as fetching software instructions and then performing the actions specified in the fetched instructions. These actions may include, for example, adding, subtracting, multiplying, and comparing numbers, performing logical operations such as AND, OR, NOR and XOR, and retrieving data. Each computing engine 203A and 203B may then use its corresponding memory cache 205A and 205B, respectively, to quickly store and retrieve data and/or instructions for execution.

Each processor core 201A and 201B is connected to an interconnect 207. The particular construction of the interconnect 207 may vary depending upon the architecture of the processor unit 105. With some processor cores 201A and 201B, such as the Cell microprocessor created by Sony Corporation, Toshiba Corporation and IBM Corporation, the interconnect 207 may be implemented as an interconnect bus. With other processor units 201A and 201B, however, such as the Opteron™ and Athlon™ dual-core processors available from Advanced Micro Devices of Sunnyvale, Calif., the interconnect 207 may be implemented as a system request interface device. In any case, the processor cores 201A and 201B communicate through the interconnect 207 with an input/output interface 209 and a memory controller 210. The input/output interface 209 provides a communication interface to the bus 113. Similarly, the memory controller 210 controls the exchange of information to the system memory 107. With some implementations, the processor unit 105 may include additional components, such as a high-level cache memory accessible shared by the processor cores 201A and 201B. It also should be appreciated that the description of the computer network illustrated in FIG. 1 and FIG. 2 is provided as an example only, and is not intended to suggest any limitation as to the scope of use or functionality of alternate embodiments.

Mixed-Signal Simulation for Complex Design Topologies

Figure 3:
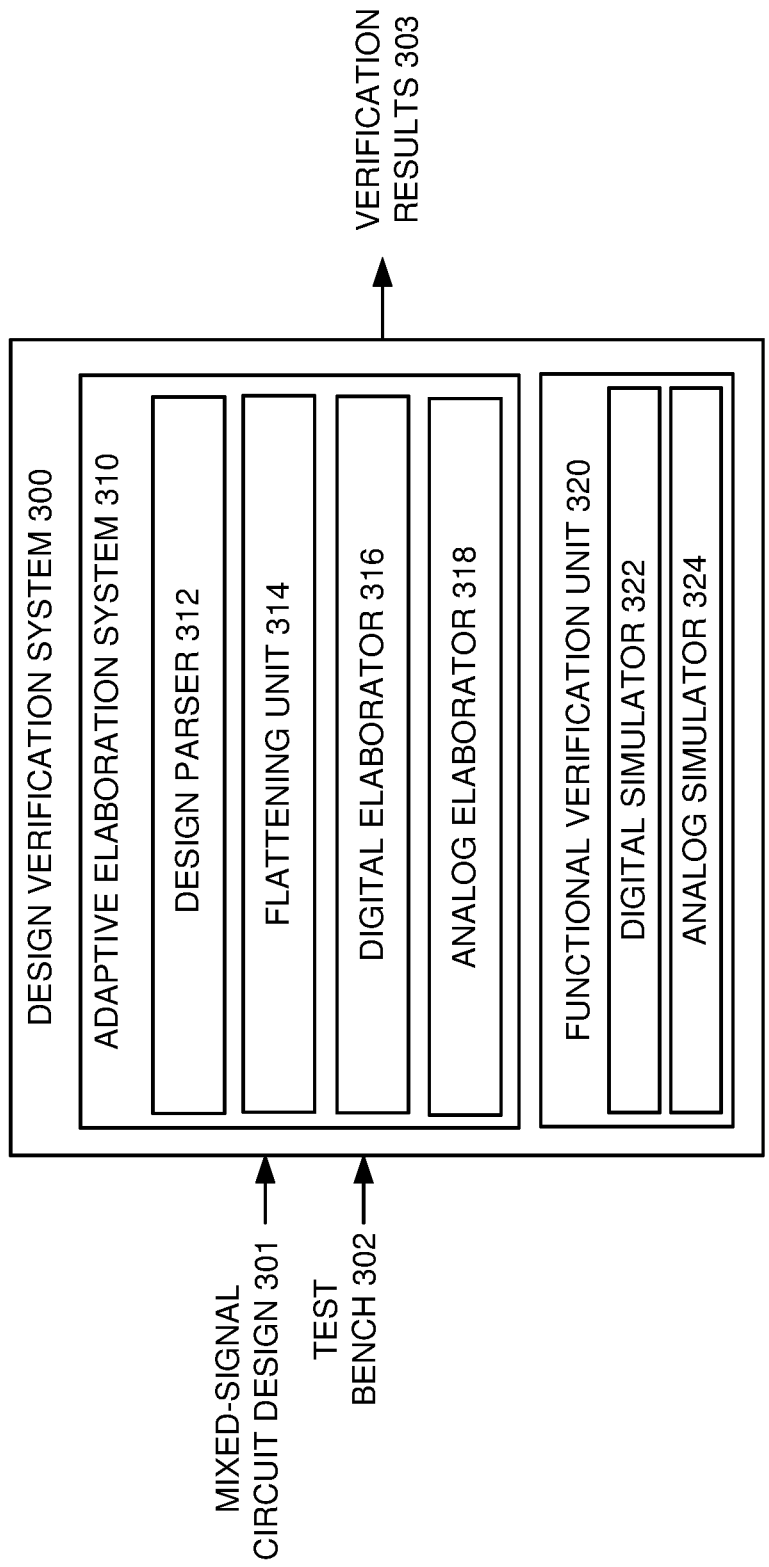
FIG. 3 illustrates an example design verification system for performing mixed-signal simulation on complex design topologies that may be implemented according to various embodiments.
Figure 4:
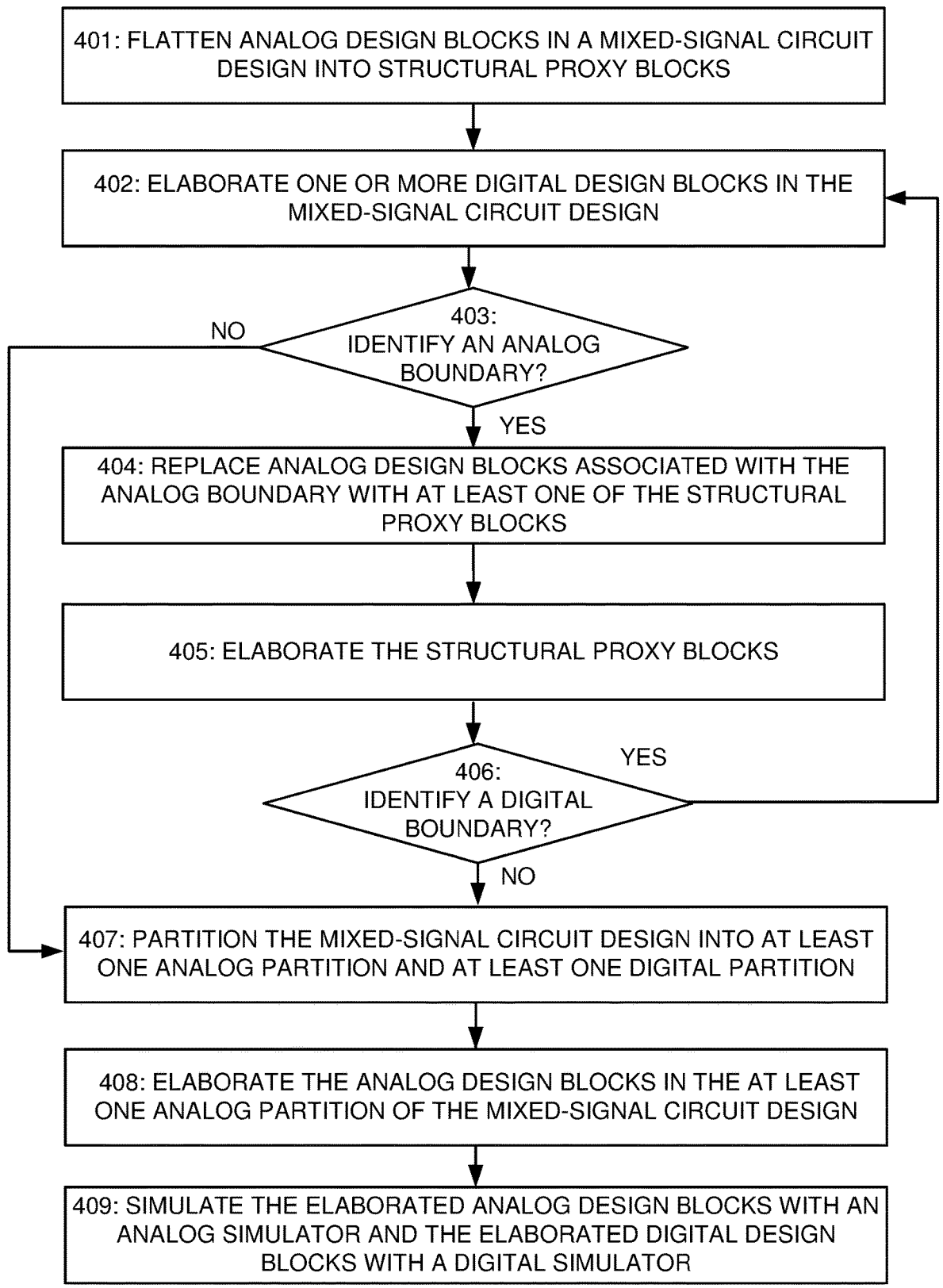
FIG. 4 illustrates a flowchart showing an example implementation of mixed-signal simulation for complex design topologies according to various examples.

FIG. 3 illustrates an example design verification system 300 for performing mixed-signal simulation on complex design topologies that may be implemented according to various embodiments. FIG. 4 illustrates a flowchart showing an example implementation of mixed-signal simulation for complex design topologies according to various examples. Referring to FIGS. 3 and 4, the design verification system 300 can receive a mixed-signal circuit design 301 of an electronic system having both analog circuitry and digital circuitry. The mixed-signal circuit design 301 can describe the electronic system in terms of both the exchange of analog and digital signals between circuit components and the operations that can be performed on those signals. The mixed-signal circuit design 301 can be written in one or more Hardware Design Languages (HDLs), such as System Verilog, Verilog, Verilog Analog (Verilog-A), Very high speed integrated circuit Hardware Design Language (VHDL), Verilog Analog Mixed Signal (Verilog-AMS), VHDL-AMS, System-C, Simulation Program with Integrated Circuit Emphasis (SPICE), Eldo-SPICE, Spectre, or the like.

The design verification system 300, for example, implemented in the computing device 101 of FIG. 1, can receive a test bench 302 capable of defining test stimulus, for example, clock signals, activation signals, power signals, control signals, data signals, or the like, that, when grouped, may form test bench transactions capable of prompting operation of the mixed-signal circuit design 301 in a verification environment, such as a mixed-signal simulation environment. In some embodiments, the test bench 302 can be written in an object-oriented programming language, for example, SystemVerilog or the like, that, when executed during elaboration, can dynamically generate test bench components for verification of the mixed-signal circuit design 301. A methodology library, for example, a Universal Verification Methodology (UVM) library, an Open Verification Methodology (OVM) library, an Advanced Verification Methodology (AVM) library, a Verification Methodology Manual (VMM) library, or the like, can be utilized as a base for creating the test bench 302.

The design verification tool 300 can include an adaptive elaboration system 310 to separately elaborate digital portions of the mixed-signal circuit design 301 and analog portions of the mixed-signal circuit design 301. The adaptive elaboration system 310 can include a design parser 312 and a flattening unit 314 that can work together to traverse a design hierarchy of the mixed-signal circuit design 301 to locate design blocks and to determine their type, such as an analog design block, a digital design block, or an analog mixed-signal design block. For example, the design parser 312 and the flattening unit 314 can identify connections from the top-level design block to lower-level design blocks in the mixed-signal circuit design 301 and determine a design type for the lower-level design blocks, such as an analog design block, a digital design block, or an analog mixed-signal design block. The design parser 312 and the flattening unit 314 can then identify connections from the lower-level design blocks to even lower-level design blocks in the mixed-signal circuit design 301 and determine a design type for the even lower-level design blocks, such as an analog design block, a digital design block, or an analog mixed-signal design block.

The design parser 312 and the flattening unit 314 can utilize the identified connections between the design blocks to discover transitions in design types for the design blocks in the design hierarchy, and associate the transitions in design type to analog-digital boundaries in the mixed-signal circuit design 301. For example, the design parser 312 and the flattening unit 314 can traverse the design hierarchy of the mixed-signal circuit design 301 to identify locations where the mixed-signal circuit design 301 includes an analog design block connecting to a digital design block or an analog mixed-signal design block. Those identified locations can correspond to the analog-digital boundaries between digital portions of the mixed-signal circuit design 301 and analog portions of the mixed-signal circuit design 301.

The design parser 312 and the flattening unit 314 can identify the mixed-signal circuit design 301 has a complex topology, such as including one or more sandwich design structures having a digital design block coupled between two analog design blocks in a hierarchy and/or having an analog design block coupled between two digital design blocks in the hierarchy. In some embodiments, a sandwich design structure can include digital design blocks and analog design blocks stacked on top of each other in the mixed-signal circuit design 301 and connected through interconnects that carry signals from an analog continuous time domain to a digital discrete time domain, and vice versa. An example of a complex sandwich mixed signal design is described with reference to FIG. 5A.

Figure 5A:
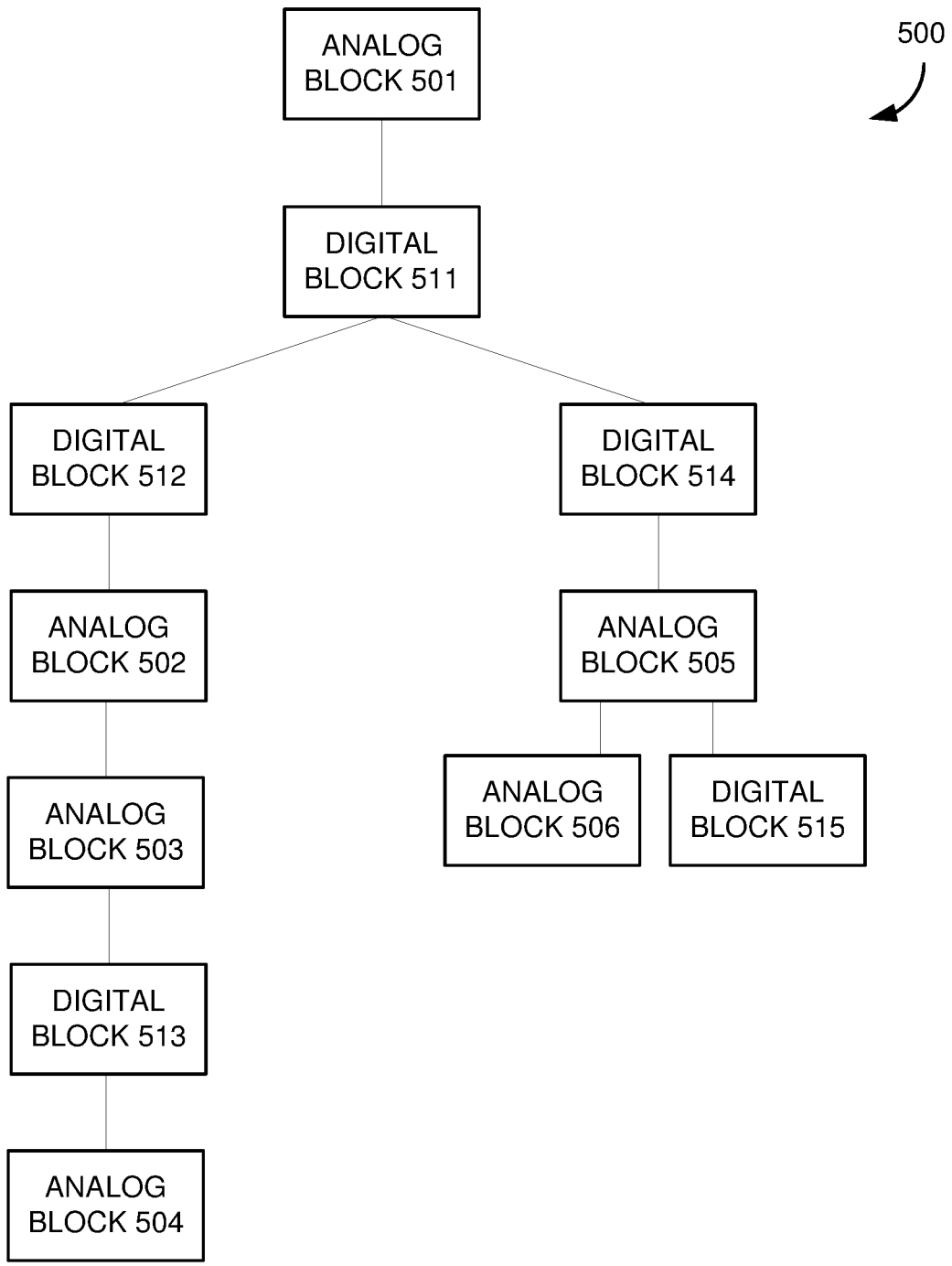
FIG. 5A illustrates an example of a complex sandwich mixed-signal design according to various embodiments.

FIG. 5A illustrates an example of a complex sandwich mixed-signal design 500 according to various embodiments. Referring to FIG. 5A, the complex sandwich mixed-signal design 500 can include analog blocks 501-506 describing portions of an electronic system in terms of both the exchange of analog signals between circuit components and the operations that can be performed on those signals. The complex sandwich mixed-signal design 500 also can include digital blocks 511-515 describing portions of the electronic system in terms of both the exchange of digital signals between circuit components and the operations that can be performed on those signals.

The complex sandwich mixed-signal design 500 can have a hierarchical structure, for example, with a top-level design block connected in a tree-like format to other design blocks in the complex sandwich mixed-signal design 500. The complex sandwich mixed-signal design 500 can have the analog blocks 501-506 interleaved with the digital blocks 511-515, which can create one or more analog islands or digital islands in the complex sandwich mixed-signal design 500. In some embodiments, an analog island can include a group of one or more analog blocks connected to a higher-level digital block and a lower-level digital block in the complex sandwich mixed-signal design 500. A digital island can include a group of one or more digital blocks connected to a higher-level analog block and a lower-level analog block in the complex sandwich mixed-signal design 500.

Referring back to FIGS. 3 and 4, the flattening unit 314 that, in a block 401, can flatten one or more analog design blocks in the mixed-signal circuit design 301 into one or more structural proxy blocks capable of being elaborated by a digital elaborator 316. In some embodiments, the structural proxy blocks can be a skeleton of the analog design blocks described in a Hardware Description Language (HDL) and represent the hierarchy and connectivity of the one or more analog design blocks. By flattening the analog design blocks into the structural proxy blocks, the digital elaborator 316 can elaborate digital design blocks in the mixed-signal circuit design 301 even when separated by islands of analog design blocks in the hierarchy of the mixed-signal circuit design 301.

The flattening unit 314 can flatten the analog design blocks located on the analog-digital boundaries in the mixed-signal circuit design 301 into the structural proxy blocks. An example of flattening the analog design blocks 501-506 in FIG. 5A into structural proxy blocks for use during an iterative digital elaboration is described with reference to FIG. 5B. Although FIGS. 3 and 4 describe flattening analog design blocks into structural proxy blocks for use during an iterative digital elaboration, in some embodiments, the digital design blocks in the complex mixed-signal design 301 can be flattened into structural proxy blocks for use during an iterative analog elaboration.

Figure 5B:
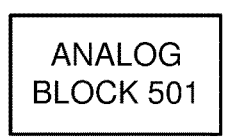
FIG. 5B illustrates an example of flattened analog portion of a complex sandwich mixed-signal design according to various embodiments.
Figure 5B:
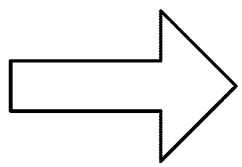
Figure 5B:
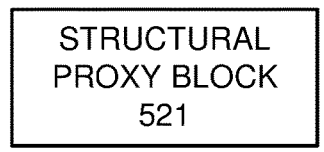
Figure 5B:
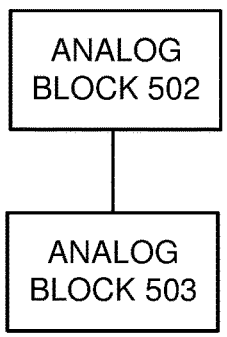
Figure 5B:
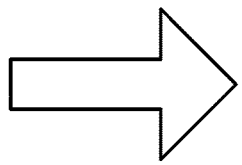
Figure 5B:
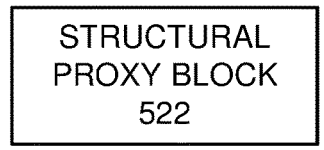
Figure 5B:
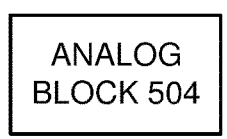
Figure 5B:
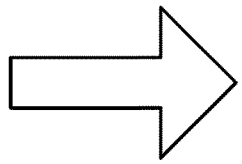
Figure 5B:
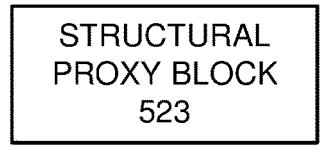
Figure 5B:
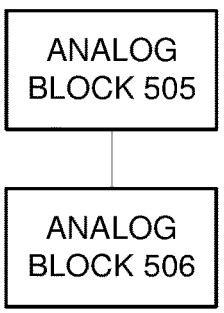
Figure 5B:
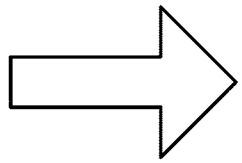
Figure 5B:
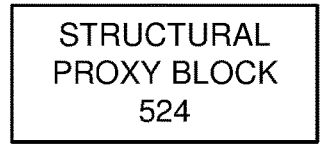

FIG. 5B illustrates an example of flattened analog portion of a complex sandwich mixed-signal design 500 according to various embodiments. Referring to FIG. 5B, the analog blocks 501-506 parsed from the complex sandwich mixed-signal design 500 can be flattened into structural proxy blocks 521-524. The structural proxy block 521 corresponds to a flattened representation of the analog block 501, which is the top-block of the complex sandwich mixed-signal design 500, and includes connectivity to a lower-level digital block 511 in the complex sandwich mixed-signal design 500. The structural proxy block 522 corresponds to a flattened representation of the analog blocks 502 and 503. The structural proxy block 522 can describe the hierarchy of the analog blocks and include connectivity to a higher-level digital block 512 and a lower-level digital block 513 in the complex sandwich mixed-signal design 500. The structural proxy block 523 corresponds to a flattened representation of the analog block 504. The structural proxy block 523 can describe the hierarchy of the analog blocks and include connectivity to a higher-level digital block 513 in the complex sandwich mixed-signal design 500. The structural proxy block 524 corresponds to a flattened representation of the analog blocks 505 and 506. The structural proxy block 524 can describe the hierarchy of the analog blocks and include connectivity to a higher-level digital block 514 and a lower-level digital block 515 in the complex sandwich mixed-signal design 500.

Referring back to FIGS. 3 and 4, the digital elaborator 316 in the adaptive elaboration system 310, in a block 402, can elaborate one or more digital design blocks in the mixed-signal circuit design. When the top-block in the mixed-signal circuit design 301 corresponds to a digital design block, the digital elaborator 316 can begin elaborating the digital top-block. When the top-block in the mixed-signal circuit design 301 corresponds to an analog design block, the digital elaborator 316 can begin elaborating a structural proxy block generated from the analog top-block and proceed to the lower-level digital design blocks connected to the structural proxy block in the mixed signal circuit design 301.

The adaptive elaboration system 310, in a block 403, can determine whether the elaboration of the digital design blocks in the mixed-signal circuit design identifies an analog boundary having one or more analog design blocks for elaboration. In some embodiments, the digital elaborator 316, during the elaboration of the digital design blocks, can identify that one of the digital design blocks connects to a lower-level analog design block, which corresponds to the analog boundary.

When the adaptive elaboration system 310, in the block 403, identifies an analog boundary having one or more analog design blocks for elaboration, the adaptive elaboration system 310, in a block 404, can replace analog design blocks associated with the analog boundary with at least one of the structural proxy blocks associated with the analog design blocks and, in a block 405, the digital elaborator 316 can elaborate structural proxy blocks that replaced the analog design blocks. In some embodiments, the adaptive elaboration system 310 can provide the digital elaborator 316 with the structural proxy blocks associated with the analog design blocks at the analog boundary.

The digital elaborator 316, in a block 406, can determine whether the elaboration of the structural proxy blocks identifies a digital boundary having one or more digital design blocks for elaboration. Since the structural proxy blocks represent the hierarchy and the connectivity of the analog design blocks, the digital elaborator 316 can identify a connectivity of the structural proxy blocks to lower-level digital design blocks in the mixed-signal circuit design 301.

When the digital elaborator 316, in the block 406, identifies the digital boundary having one or more digital design blocks for elaboration, the digital elaborator 316 can return to the block 402 to elaborate the digital design blocks associated with the digital boundary. This process of elaborating digital design blocks, identifying lower-level analog design block in the mixed-sign circuit design 301 during the elaboration, and elaborating structural proxy blocks of the identified analog design blocks can iterate until another analog boundary cannot be identified in the block 403 or until another digital boundary cannot be identified in the block 406.

In some embodiments, the adaptive elaboration system 310 can insert translator cells at boundaries between the analog and digital portions of the mixed-signal circuit design 301, which can be elaborated by the digital elaborator 316. The elaborated translator cells can allow a digital portion of the mixed-signal circuit design 301 simulated by a digital simulator 322 to communicate with an analog portion of the mixed-signal circuit design 301 simulated by the analog simulator 324. The elaboration process can render the digital design blocks in the mixed-signal circuit design 301, possibly along with one or more of the translator cells, into a format capable of being simulated by the digital simulator 322.

When another analog boundary cannot be identified in the block 403 or when another digital boundary cannot be identified in the block 406, the adaptive elaboration system 310 can partition the mixed-signal circuit design 301 into at least one analog partition and at least one digital partition based on the elaboration of the digital design blocks and the structural proxy blocks.

The adaptive elaboration system 310 can include an analog elaborator 318 that, in a block 408, can elaborate the analog design blocks in the at least one analog partition of the mixed-signal circuit design 301. In some embodiments, the adaptive elaboration system 310 can provide the analog elaborator 318 each group of the analog design blocks replaced in the block 404 to separately elaborate. The analog elaborator 318 can elaborate each group of the analog design blocks with one of the analog blocks in each group instantiated as a top-block. In some embodiments, the adaptive elaboration system 310 can insert translator cells at boundaries between the analog and digital partitions of the mixed-signal circuit design 301, which can be elaborated by the analog elaborator 318. The elaborated translator cells can allow an analog portion of the mixed-signal circuit design 301 simulated by an analog simulator 324 to communicate with a digital portion of the mixed-signal circuit design 301 simulated by the digital simulator 322. The elaboration process can render the analog design blocks in the mixed-signal circuit design 301, possibly along with one or more of the translator cells, into a format capable of being simulated by the analog simulator 324. The adaptive elaboration system 310 also can elaborate the test bench 302, with at least one of the digital elaborator 316 or the analog elaborator 318, into a format usable in the mixed-signal simulation environment.

Although FIGS. 3 and 4 describe an iterative digital elaboration using structural proxy blocks to replace the analog design blocks, in some embodiments, the adaptive elaboration system 310 can flatten digital design blocks into structural proxy blocks for an iterative analog elaboration.

The design verification system 300 can include a functional verification unit 320 to implement a mixed-signal verification environment, which can simulate the mixed-signal circuit design 301 and the test bench 302. The functional verification unit 320, in a block 409, can perform analog simulation on the analog partition of the mixed-signal circuit design 301 with the analog simulator 324 and perform digital simulation on the digital partition of the mixed-signal circuit design 301 with the digital simulator 322. The digital simulator 322 can simulate the functional operations performed by the digital partition of the mixed-signal circuit design 301 in response to test stimulus generated by the test bench 302, for example, using an event-based discrete time events processor. The analog simulator 324 can simulate the functional operations performed by the analog partition of the mixed-signal circuit design 301 in response to the test stimulus generated by the test bench 302, for example, using a continuous time matrix-based differential equation solvers.

The functional verification unit 320 can generate verification results 303, for example, including waveform data corresponding to the functional operation of the mixed-signal circuit design 301 in the mixed-signal verification environment. The design verification system 300 (or a tool external to the design verification tool 300) can perform a functional verification of the mixed-signal circuit design 301, for example, by comparing the waveform data with an expected output from the mixed-signal circuit design 301 in response the test stimulus generated by the test bench 302.

Figure 6A:
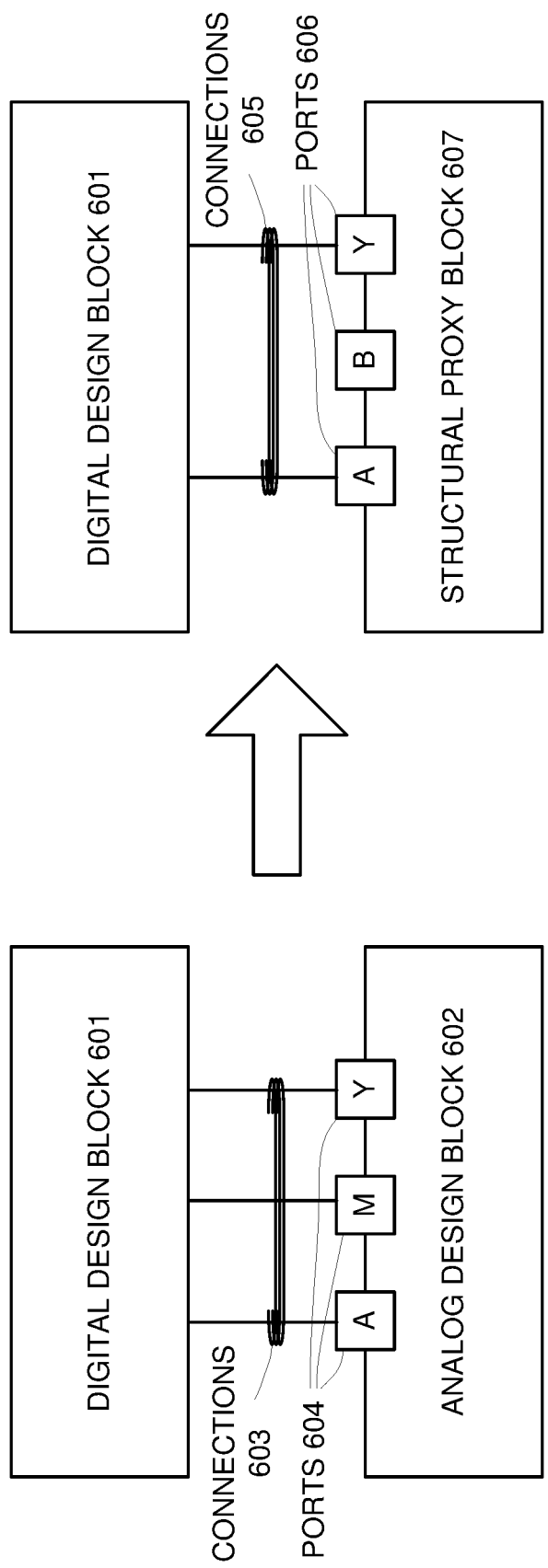
FIGS. 6A and 6B illustrates examples of flattened analog block with port matching for use during digital elaboration and flattened digital design block with port matching for use during analog elaboration according to various embodiments.
Figure 6B:
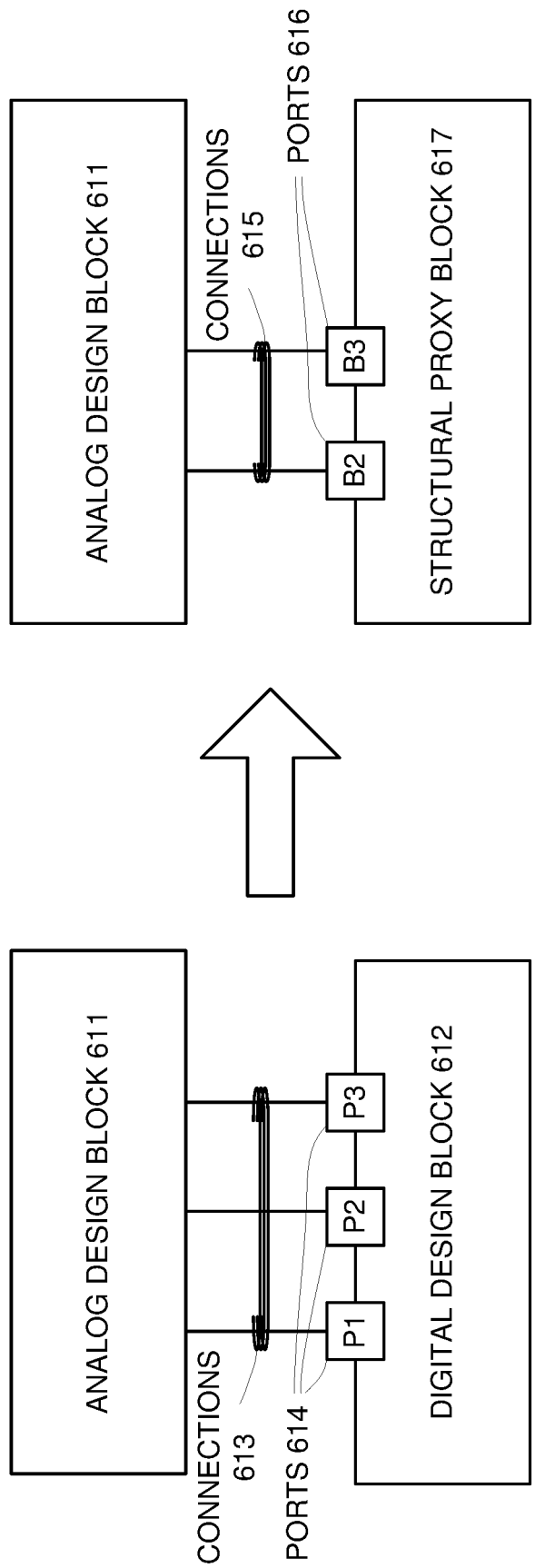

FIGS. 6A and 6B illustrates examples of flattened analog block with port mapping for use during digital elaboration and flattened digital design block with port mapping for use during analog elaboration according to various embodiments. Referring to FIG. 6A, a digital design block 601 can be a higher-level block in a hierarchy of a mixed-signal circuit design relative to an analog design block 602. The digital design block 601 can include multiple connections 603 to the analog design block 602 in the mixed-signal circuit design, for example, connections to ports 604 in the analog design block 602 labeled A, M, and Y.

The generation of a structural proxy block 607 for the analog design block 602 can include a reconfiguration of the connections 603 and ports 604 of the analog design block 602, for example, using a port mapping at the boundary between analog and digital blocks. The structural proxy block 607 can include ports 606, labeled A, B, and Y, to support the connections 605 with the digital design block 601. By altering the ports and connections during the generation of the structural proxy block 607, based on a port mapping, the structural proxy block 607 can be elaborated by a digital elaborator.

Referring to FIG. 6B, an analog design block 611 can be a higher-level block in a hierarchy of a mixed-signal circuit design relative to a digital design block 612. The analog design block 611 can include multiple connections 613 to the digital design block 612 in the mixed-signal circuit design, for example, connections to ports 614 in the digital design block 612 labeled P1, P2, and P3.

The generation of a structural proxy block 617 for the digital design block 612 can include a reconfiguration of the connections 613 and ports 614 of the digital design block 612, for example, using a port mapping at the boundary between analog and digital blocks. The structural proxy block 617 can include ports 616, labeled B2 and B3, to support the connections 615 with the analog design block 611. The structural proxy block 617 can have a reduction in a number of the ports 614 in the digital design block 612 down to the ports 616 due to a lack of a power connection in the structural proxy block 617. For example, the analog design block 611 can be connected to the digital design block 612 according to analog rules including power port connections, but, during parsing, the digital design block 612 may not include a power port, so the structural proxy block 617 can have the ports 616 reflecting the digital interface identified during the parsing of the digital design block 612. By altering the ports and connections during the generation of the structural proxy block 617, based on a port mapping, the structural proxy block 617 can be elaborated by an analog elaborator.

The system and apparatus described above may use dedicated processor systems, micro controllers, programmable logic devices, microprocessors, or any combination thereof, to perform some or all of the operations described herein. Some of the operations described above may be implemented in software and other operations may be implemented in hardware. Any of the operations, processes, and/or methods described herein may be performed by an apparatus, a device, and/or a system substantially similar to those as described herein and with reference to the illustrated figures.

The processing device may execute instructions or "code" stored in memory. The memory may store data as well. The processing device may include, but may not be limited to, an analog processor, a digital processor, a microprocessor, a multi-core processor, a processor array, a network processor, or the like. The processing device may be part of an integrated control system or system manager, or may be provided as a portable electronic device configured to interface with a networked system either locally or remotely via wireless transmission.

The processor memory may be integrated together with the processing device, for example RAM or FLASH memory disposed within an integrated circuit microprocessor or the like. In other examples, the memory may comprise an independent device, such as an external disk drive, a storage array, a portable FLASH key fob, or the like. The memory and processing device may be operatively coupled together, or in communication with each other, for example by an I/O port, a network connection, or the like, and the processing device may read a file stored on the memory. Associated memory may be "read only" by design (ROM) by virtue of permission settings, or not. Other examples of memory may include, but may not be limited to, WORM, EPROM, EEPROM, FLASH, or the like, which may be implemented in solid state semiconductor devices. Other memories may comprise moving parts, such as a known rotating disk drive. All such memories may be "machine-readable" and may be readable by a processing device.

Operating instructions or commands may be implemented or embodied in tangible forms of stored computer software (also known as "computer program" or "code"). Programs, or code, may be stored in a digital memory and may be read by the processing device. "Computer-readable storage medium" (or alternatively, "machine-readable storage medium") may include all of the foregoing types of memory, as well as new technologies of the future, as long as the memory may be capable of storing digital information in the nature of a computer program or other data, at least temporarily, and as long at the stored information may be "read" by an appropriate processing device. The term "computer-readable" may not be limited to the historical usage of "computer" to imply a complete mainframe, mini-computer, desktop or even laptop computer. Rather, "computer-readable" may comprise storage medium that may be readable by a processor, a processing device, or any computing system. Such media may be any available media that may be locally and/or remotely accessible by a computer or a processor, and may include volatile and non-volatile media, and removable and non-removable media, or any combination thereof.

A program stored in a computer-readable storage medium may comprise a computer program product. For example, a storage medium may be used as a convenient means to store or transport a computer program. For the sake of convenience, the operations may be described as various interconnected or coupled functional blocks or diagrams. However, there may be cases where these functional blocks or diagrams may be equivalently aggregated into a single logic device, program or operation with unclear boundaries.

CONCLUSION

While the application describes specific examples of carrying out embodiments of the invention, those skilled in the art will appreciate that there are numerous variations and permutations of the above described systems and techniques that fall within the spirit and scope of the invention as set forth in the appended claims. For example, while specific terminology has been employed above to refer to design processes, it should be appreciated that various examples of The invention may be implemented using any desired combination of electronic design automation processes.

One of skill in the art will also recognize that the concepts taught herein can be tailored to a particular application in many other ways. In particular, those skilled in the art will recognize that the illustrated examples are but one of many alternative implementations that will become apparent upon reading this disclosure.

Although the specification may refer to "an", "one", "another", or "some" example(s) in several locations, this does not necessarily mean that each such reference is to the same example(s), or that the feature only applies to a single example.

The invention claimed is:

1. A method comprising:
elaborating, by a computing system, a digital portion of a mixed-signal circuit design by replacing an analog portion of the mixed-signal circuit design with structural proxy blocks corresponding to a flattened representation of analog design blocks in the analog portion and elaborating the structural proxy blocks and digital design blocks associated with the digital portion of the mixed-signal circuit design;
elaborating, by the computing system, the analog portion of the mixed-signal design by separately elaborating the analog design blocks associated with the structural proxy blocks; and
simulating, by the computing system, the elaborated analog portion with an analog simulator and the elaborated digital portion with a digital simulator.

2. The method of claim 1, further comprising:
parsing, by the computing system, the mixed-signal circuit design to identify the analog design blocks; and
flattening, by the computing system, the analog design blocks in the analog portion of the mixed-signal circuit design into the structural proxy blocks.

3. The method of claim 2, wherein flattening the analog design blocks into the structural proxy blocks includes generating a skeleton for the analog design blocks, which includes a block hierarchy and parameter connections similar to the analog design blocks.

4. The method of claim 1, wherein elaborating the digital portion of the mixed-signal design includes elaborating one or more digital design blocks associated with the digital portion of the mixed-signal design, identifying a boundary with the analog portion of the mixed signal design, and elaborating the structural proxy blocks associated with the identified analog portion of the mixed-signal design.

5. The method of claim 4, wherein the elaboration of the structural proxy blocks associated with the identified analog portion of the mixed-signal design identifies at least one subsequent digital design block connected to at least one of the structural proxy blocks, and wherein elaborating the digital portion of the mixed-signal design includes elaborating the at least one subsequent digital design block.

6. The method of claim 1, further comprising partitioning, by the computing system, the mixed-signal circuit design into at least one analog partition and at least one digital partition based on the elaboration of the digital portion of the mixed-signal circuit.

7. The method of claim 6, further comprising inserting, by the computing system, translator cells into the mixed-signal circuit design between the analog partition and the digital partition, wherein the analog simulator and the digital simulator communicate during the simulation via the translator cells.

8. A system comprising:
a memory system configured to store computer-executable instructions; and
a computing system, in response to execution of the computer-executable instructions, is configured to:
elaborate a digital portion of a mixed-signal circuit design by replacing an analog portion of the mixed-signal circuit design with structural proxy blocks corresponding to a flattened representation of analog design blocks in the analog portion and elaborating the structural proxy blocks and digital design blocks associated with the digital portion of the mixed-signal circuit design;
elaborate the analog portion of the mixed-signal design by separately elaborating the analog design blocks associated with the structural proxy blocks; and
simulate the elaborated analog portion with an analog simulator and the elaborated digital portion with a digital simulator.

9. The system of claim 8, wherein the computing system, in response to execution of the computer-executable instructions, is further configured to:
parse the mixed-signal circuit design to identify the analog design blocks; and
flatten the analog design blocks in the analog portion of the mixed-signal circuit design into the structural proxy blocks.

10. The system of claim 9, wherein the computing system, in response to execution of the computer-executable instructions, is further configured to flatten the analog design blocks into the structural proxy blocks by generating a skeleton for the analog design blocks, which includes a block hierarchy and parameter connections similar to the analog design blocks.

11. The system of claim 8, wherein the computing system, in response to execution of the computer-executable instructions, is further configured to elaborate the digital portion of the mixed-signal design by elaborating one or more digital design blocks associated with the digital portion of the mixed-signal design, identifying a boundary with the analog portion of the mixed signal design, and elaborating the structural proxy blocks associated with the identified analog portion of the mixed-signal design.

12. The system of claim 11, wherein the elaboration of the structural proxy blocks associated with the identified analog portion of the mixed-signal design identifies at least one subsequent digital design block connected to at least one of the structural proxy blocks, and wherein the elaboration of the digital portion of the mixed-signal design includes elaborating the at least one subsequent digital design block.

13. The system of claim 8, wherein the computing system, in response to execution of the computer-executable instructions, is further configured to:
partition the mixed-signal circuit design into at least one analog partition and at least one digital partition based on the elaboration of the digital portion of the mixed-signal circuit; and
insert translator cells into the mixed-signal circuit design between the analog partition and the digital partition, wherein the analog simulator and the digital simulator communicate during the simulation via the translator cells.

14. An apparatus comprising at least one computer-readable memory device storing instructions configured to cause one or more processing devices in a computing system to perform operations comprising:

elaborating a digital portion of a mixed-signal circuit design by replacing an analog portion of the mixed-signal circuit design with structural proxy blocks corresponding to a flattened representation of analog design blocks in the analog portion and elaborating the structural proxy blocks and digital design blocks associated with the digital portion of the mixed-signal circuit design;

elaborating the analog portion of the mixed-signal design by separately elaborating the analog design blocks associated with the structural proxy blocks; and simulating the elaborated analog portion with an analog simulator and the elaborated digital portion with a digital simulator.

15. The apparatus of claim 14, wherein the instructions are configured to cause one or more processing devices to perform operations further comprising parsing the mixed-signal circuit design to identify the analog design blocks; and flattening the analog design blocks in the analog portion of the mixed-signal circuit design into the structural proxy blocks.

16. The apparatus of claim 15, wherein flattening the analog design blocks into the structural proxy blocks includes generating a skeleton for the analog design blocks, which includes a block hierarchy and parameter connections similar to the analog design blocks.

17. The apparatus of claim 14, wherein elaborating the digital portion of the mixed-signal design includes elaborating one or more digital design blocks associated with the digital portion of the mixed-signal design, identifying a boundary with the analog portion of the mixed signal design, and elaborating the structural proxy blocks associated with the identified analog portion of the mixed-signal design.

18. The apparatus of claim 17, wherein the elaboration of the structural proxy blocks associated with the identified analog portion of the mixed-signal design identifies at least one subsequent digital design block connected to at least one of the structural proxy blocks, and wherein elaborating the digital portion of the mixed-signal design includes elaborating the at least one subsequent digital design block.

19. The apparatus of claim 14, wherein the instructions are configured to cause one or more processing devices to perform operations further comprising partitioning the mixed-signal circuit design into at least one analog partition and at least one digital partition based on the elaboration of the digital portion of the mixed-signal circuit.

20. The apparatus of claim 19, wherein the instructions are configured to cause one or more processing devices to perform operations further comprising inserting translator cells into the mixed-signal circuit design between the analog partition and the digital partition, wherein the analog simulator and the digital simulator communicate during the simulation via the translator cells.

\* \* \* \* \*